(12) United States Patent

Gollier et al.

(10) Patent No.: US 7,505,492 B2
(45) Date of Patent: Mar. 17, 2009

(54) ALIGNMENT OF LASING WAVELENGTH WITH WAVELENGTH CONVERSION PEAK USING MODULATED WAVELENGTH CONTROL SIGNAL

(75) Inventors: Jacques Gollier, Painted Post, NY (US); Martin Hai Hu, Painted Post, NY (US); Stephen Randall Mixon, Painted Post, NY (US); Dragan Pikula, Horseheads, NY (US); Daniel Ohen Rickets, Corning, NY (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 58 days.

(21) Appl. No.: 11/894,846

(22) Filed: Aug. 22, 2007

(65) Prior Publication Data

US 2008/0279234 A1     Nov. 13, 2008

Related U.S. Application Data

(60) Provisional application No. 60/928,725, filed on May 11, 2007.

(51) Int. Cl.
*H01S 3/13* (2006.01)

(52) U.S. Cl. .............................. 372/29.011; 372/29.01; 372/20; 372/22

(58) Field of Classification Search ............ 372/29.011, 372/29.01, 20, 21, 22
See application file for complete search history.

(56) References Cited

U.S. PATENT DOCUMENTS

| | | | | |
|---|---|---|---|---|
| 4,709,369 A | 11/1987 | Howard | ........................ | 372/38 |
| 4,744,087 A | 5/1988 | Nicia | ........................... | 372/38 |
| 4,796,267 A | 1/1989 | Yamada et al. | ................. | 372/38 |
| 4,912,717 A | 3/1990 | Takeuchi | ...................... | 372/38 |
| 5,123,024 A | 6/1992 | Dowd et al. | .................... | 372/38 |
| 5,168,503 A | 12/1992 | Maeda | ......................... | 372/29 |
| 5,220,578 A | 6/1993 | Koch et al. | ..................... | 372/96 |
| 5,410,561 A * | 4/1995 | Ogawa | ......................... | 372/22 |
| 5,515,392 A | 5/1996 | Teremy | ........................ | 372/38 |
| 5,936,985 A | 8/1999 | Yamamoto et al. | ............ | 372/38 |
| 6,058,128 A | 5/2000 | Ventrudo | ...................... | 372/96 |
| 6,215,809 B1 | 4/2001 | Ziari et al. | ..................... | 372/96 |
| 6,222,861 B1 | 4/2001 | Kuo et al. | ...................... | 372/20 |
| 6,229,832 B1 | 5/2001 | Baba et al. | ................ | 372/38.01 |
| 6,323,990 B1 | 11/2001 | Yamamoto et al. | .......... | 359/328 |
| 6,330,253 B1 | 12/2001 | Tuganov et al. | ................. | 372/9 |
| 6,434,173 B1 | 8/2002 | Tuganov et al. | ................. | 372/9 |
| 6,671,465 B1 | 12/2003 | Cohen et al. | .................. | 398/66 |

(Continued)

FOREIGN PATENT DOCUMENTS

JP         2006-011332         1/2006

*Primary Examiner*—Minsun Harvey
*Assistant Examiner*—Kinam Park
(74) *Attorney, Agent, or Firm*—Kwadjo Adusei-Poku (57) ABSTRACT

According to one embodiment of the present invention, a programmable light source comprises one or more semiconductor lasers, a wavelength conversion device, and a laser controller. The controller is programmed to operate the semiconductor laser using a modulated feedback control signal. The wavelength control signal is adjusted based on the results of a comparison of a detected intensity signal with a feedback signal to align the lasing wavelength with the conversion efficiency peak of the wavelength conversion device. Laser controllers and projections systems operating according to the control concepts of the present invention are also provided.

20 Claims, 6 Drawing Sheets

U.S. PATENT DOCUMENTS

| | | |
|---|---|---|
| 7,010,006 B2 | 3/2006 | Kasazumi et al. ........ 372/29.02 |
| 7,154,923 B2 | 12/2006 | Kucharski ............. 372/29.015 |
| 2002/0075918 A1 | 6/2002 | Crowder .................. 372/38.02 |
| 2004/0066807 A1 | 4/2004 | Kasazumi et al. ............. 372/22 |
| 2006/0182441 A1 | 8/2006 | Kish, Jr. et al. ............... 398/33 |
| 2006/0215716 A1 | 9/2006 | Luo et al. ................ 372/38.08 |
| 2006/0291510 A1 | 12/2006 | Juluri .................... 372/29.021 |
| 2007/0002909 A1 | 1/2007 | Furukawa et al. ............. 372/22 |

* cited by examiner

ALIGNMENT OF LASING WAVELENGTH WITH WAVELENGTH CONVERSION PEAK USING MODULATED WAVELENGTH CONTROL SIGNAL

CROSS REFERENCE TO RELATED APPLICATIONS

This application is related to copending and commonly assigned U.S. patent application Ser. No. 60/928,725, filed May 11, 2007, for WAVELENGTH CONTROL IN WAVELENGTH SELECTIVE, PHASE, AND GAIN REGIONS OF SEMICONDUCTOR LASERS (D 20254) and Ser. No. 11/549,856, filed Oct. 16, 2006, for WAVELENGTH CONTROL IN SEMICONDUCTOR LASERS (D 20106/SP06-157), but does not claim priority thereto.

SUMMARY OF THE INVENTION

The present invention relates generally to semiconductor lasers, laser controllers, laser projection systems, and other optical systems incorporating semiconductor lasers. More particularly, by way of illustration and not limitation, embodiments of the present invention relate generally to methods of aligning the lasing wavelength of a semiconductor laser with the conversion peak of the wavelength conversion device that is optically coupled to the output of the laser.

For example, short wavelength sources can be configured for high-speed modulation by combining a single-wavelength semiconductor laser, such as a distributed feedback (DFB) laser, a distributed Bragg reflector (DBR) laser, or a Fabry-Perot laser with a wavelength conversion device, such as a second harmonic generation (SHG) crystal. The SHG crystal can be configured to generate higher harmonic waves of the fundamental laser signal by tuning, for example, a 1060nm DBR or DFB laser to the spectral center of an SHG crystal, which converts the wavelength to 530nm. However, the wavelength conversion efficiency of an SHG crystal, such as MgO-doped ally poled lithium niobate (PPLN), is strongly dependent on the wavelength matching between the laser diode and the SHG device. As will be appreciated by those familiar with laser design, SHG crystals use second harmonic generation properties of non-linear crystals to frequency-double laser radiation directed into the crystal. DFB lasers are resonant-cavity lasers using grids or similar structures etched into the semiconductor material as a reflective medium. DBR lasers are lasers in which the etched grating is physically separated from the electronic pumping area of the semiconductor laser.

The bandwidth of a PPLN SHG device is often very small—for a typical PPLN SHG wavelength conversion device, the full width half maximum (FWHM) wavelength conversion bandwidth is often only in the 0.16 to 0.2 nm range and mostly depends on the length of the crystal. Mode hopping and uncontrolled large wavelength variations within the laser cavity due to change of the drive current can cause the output wavelength of a semiconductor laser to move outside of this allowable bandwidth during operation. Once the semiconductor laser wavelength deviates outside the wavelength conversion bandwidth of the PPLN SHG device, the output power of the conversion device at the target wavelength drops drastically. For example, the DBR section temperature is affected by the amplitude of the gain-section drive current due to the thermal-crosstalk effect. There are other factors that make the DBR laser wavelength different from the PPLN wavelength, including variation of the ambient temperature and manufacturing tolerance of a DBR laser and a PPLN. In laser projection systems using a light source consisting of a DBR laser and a PPLN, for example, the wavelength mismatch between a DBR laser and a PPLN is particularly problematic because it can generate unintentional changes in power that will be readily visible as defects at specific locations in the image. These visible defects typically manifest themselves as organized, patterned image defects across the image because the generated image is simply the signature of the temperature crosstalk from the gain section to the DBR section.

Given the challenges associated with wavelength matching and stabilization in developing semiconductor laser sources, the present inventors have recognized beneficial means for controlling the wavelength of the semiconductor laser to maintain proper alignment of the lasing wavelength with the wavelength conversion peak of the wavelength conversion device. For example, and not by way of limitation, laser controllers programmed to operate semiconductor lasers according to the concepts of the present invention are contemplated—as are light sources and laser projection systems driven by such controllers. Although the concepts of the present invention are described primarily in the context of image forming and laser projection, it is contemplated that various concepts of the present invention may also be applicable to any laser application where repeatable low frequency fluctuation of the laser wavelength is an issue.

BRIEF DESCRIPTION OF THE DRAWINGS

The following detailed description of specific embodiments of the present invention can be best understood when read in conjunction with the following drawings, where like structure is indicated with like reference numerals and in which.

DETAILED DESCRIPTION

Figure 1:
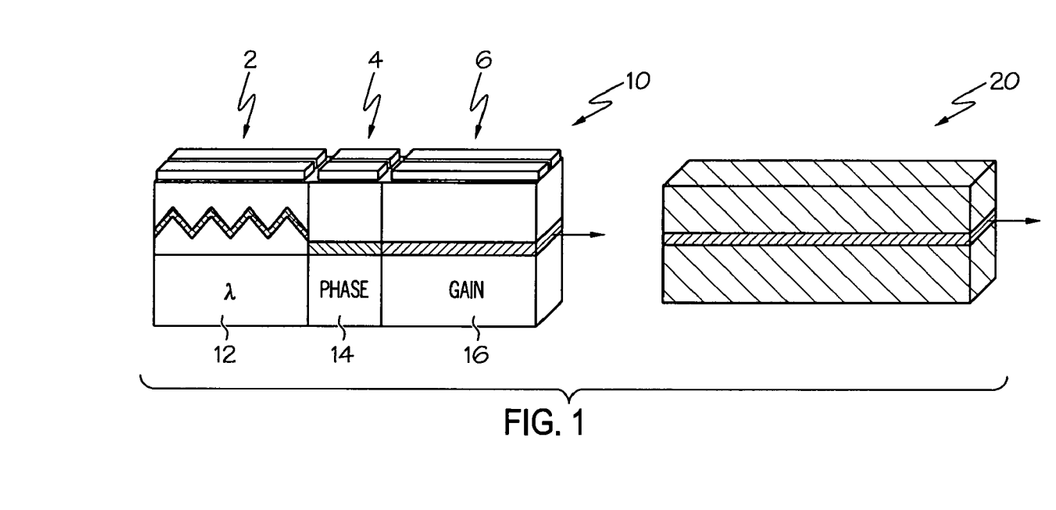
FIG. 1 is a schematic illustration of a DBR or similar type semiconductor laser optically coupled to a light wavelength conversion device.

Although the specific structure of the various types of semiconductor lasers in which the concepts of particular embodiments of the present invention can be incorporated is taught in readily available technical literature relating to the design and fabrication of semiconductor lasers, the concepts of particular embodiments of the present invention may be conveniently illustrated with general reference to a three-section DBR-type semiconductor laser 10 illustrated schematically in FIG. 1. In FIG. 1, the DBR laser 10 is optically coupled to a light wavelength conversion device 20. The light beam emitted by the semiconductor laser 10 can be either directly coupled into the waveguide of the wavelength conversion device 20 or can be coupled through collimating and focusing optics or some other type of suitable optical element or optical system. The wavelength conversion device 20 converts the incident light into higher harmonic waves and outputs the converted signal. This type of configuration is particularly useful in generating shorter wavelength laser beams from longer wavelength semiconductor lasers and can be used, for example, as a visible laser source for laser projection systems.

Although the concepts of the present invention are described primarily in the context of DBR lasers, it is contemplated that the control schemes discussed herein will also have utility in a variety of types of semiconductor lasers, including but not limited to DFB lasers, Fabry-Perot lasers, and many types of external cavity lasers.

The DBR laser 10 illustrated schematically in FIG. 1 comprises a wavelength selective section 12, a phase matching section 14, and a gain section 16. The wavelength selective section 12, which can also be referred to as the DBR section of the laser 10, typically comprises a first order or second order Bragg grating positioned outside the active region of the laser cavity. This section provides wavelength selection, as the grating acts as a mirror whose reflection coefficient depends on the wavelength. The gain section 16 of the DBR laser 10 provides the major optical gain of the laser and the phase matching section 14 creates an adjustable phase shift between the gain material of the gain section 16 and the reflective material of the wavelength selective section 12. The wavelength selective section 12 may be provided in a number of suitable alternative configurations that may or may not employ a Bragg grating.

Respective control electrodes 2, 4, 6 are incorporated in the wavelength selective section 12, the phase matching section 14, the gain section 16, or combinations thereof, and are merely illustrated schematically in FIG. 1. It is contemplated that the electrodes 2, 4, 6 may take a variety of forms. For example, the control electrodes 2, 4, 6 are illustrated in FIG. 1 as respective electrode pairs but it is contemplated that single electrode elements 2, 4, 6 in one or more of the sections 12, 14, 16 will also be suitable for practicing particular embodiments of the present invention. The control electrodes 2, 4, 6 can be used to inject electrical current into the corresponding sections 12, 14, 16 of the laser 10. For example, the injected current can be used to alter the operating properties of the laser by controlling the temperature of one or more of the laser sections, injecting electrical current into a conductively doped semiconductor region defined in the laser substrate, controlling the index of refraction of the wavelength selective 12 and phase matching 14 sections of the laser 10, controlling optical gain in the gain section 16 of the laser, etc.

Figure 3:
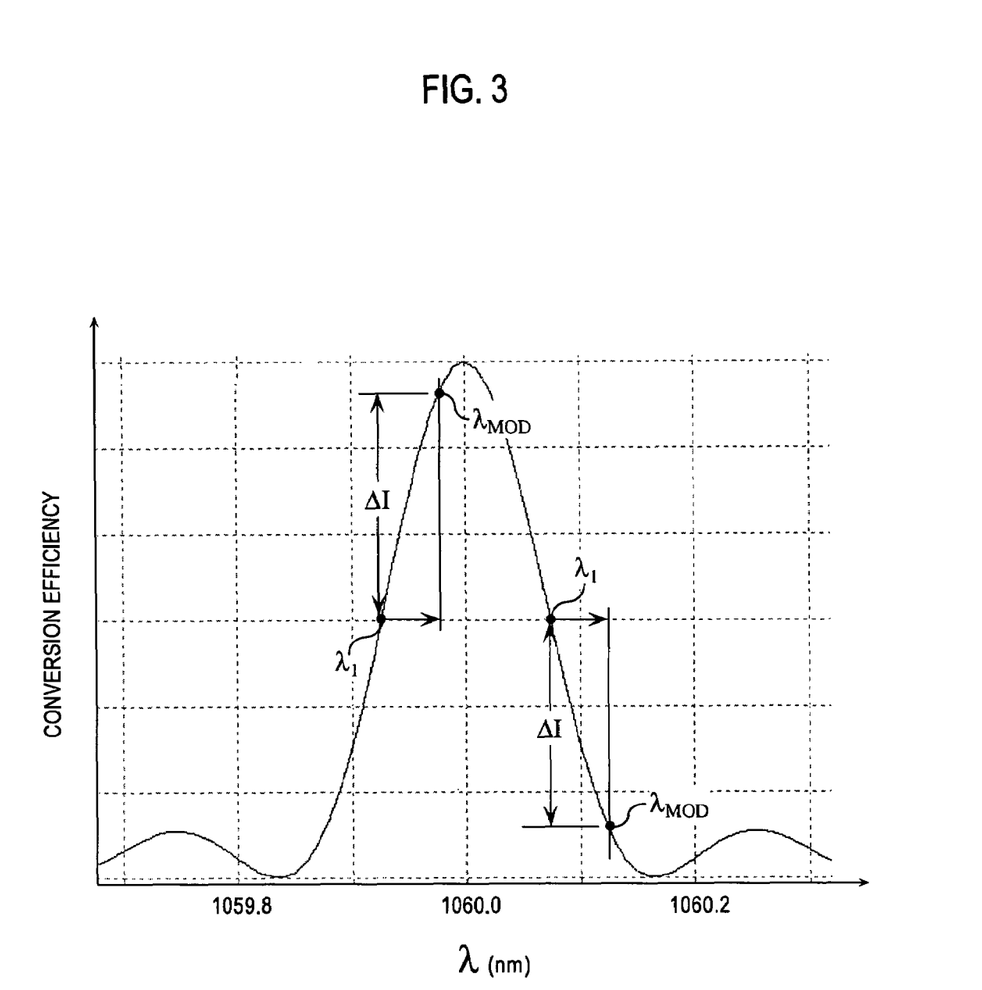
FIG. 3 illustrates an example of a conversion efficiency curve for an SHG crystal.

The wavelength conversion efficiency of the wavelength conversion device 20 illustrated in FIG. 1 is dependent on the wavelength matching between the output of the semiconductor laser 10 and the wavelength conversion efficiency curve of the wavelength conversion device 20. In cases where the wavelength conversion device 20 comprises an SHG crystal, the output power of the higher harmonic light wave generated in the SHG crystal 20 drops drastically when the output wavelength of the laser 10 deviates from the peak of the conversion efficiency curve of the SHG crystal. An example of a conversion efficiency curve for an SHG crystal is illustrated in FIG. 3. The peak of the conversion efficiency curve is positioned at about 1060 nm. Generally, the output power of the higher harmonic light wave generated in the SHG crystal 20 drops as the lasing wavelength drifts from this value. Accordingly, the lasing wavelength should be maintained as close as possible to the peak of the conversion efficiency curve (1060 nm) to operate at maximum efficiency.

However, a number of factors can affect the value of the lasing wavelength. For example, when the semiconductor laser 10 is modulated to produce data, the thermal load in the laser varies. The resulting change in laser temperature changes the lasing wavelength, creating a variation of the efficiency of the SHG crystal 20. In the case of a 12 mm-long PPLN SHG device, a temperature change in the semiconductor laser 10 of about 2° C. will typically be enough to take the output wavelength of the laser 10 outside of the 0.16 nm full width half maximum (FWHM) wavelength conversion bandwidth of the SHG crystal 20.

In addition, the present inventors have recognized that semiconductor lasers are commonly subject to wavelength drift and associated cavity mode hopping. More specifically, when the injection current applied to the gain section 16 increases, the temperature of the gain section also increases. As a consequence, the cavity modes move towards higher wavelengths. The wavelength of the cavity modes move faster than the wavelength of the DBR section so the laser reaches a point where a cavity mode of lower wavelength is closer to the maximum of the DBR reflectivity curve. At that point, the mode of lower wavelength has lower loss than the mode that is established and, according to basic principles of laser physics, the laser then automatically jumps to the mode that has lower loss. The wavelength slowly increases and includes sudden mode hops whose amplitude is equal to one free spectral range of the laser cavity. This behavior is illustrated in detail in the commonly assigned, copending U.S. patent applications noted above, the disclosures of which are incorporated herein by reference. The present inventors have also recognized that semiconductor lasers commonly exhibit a temperature evolution signature that can create unfavorable patterning in the output of the laser and the output of a wavelength conversion device coupled to the laser.

Figure 2:
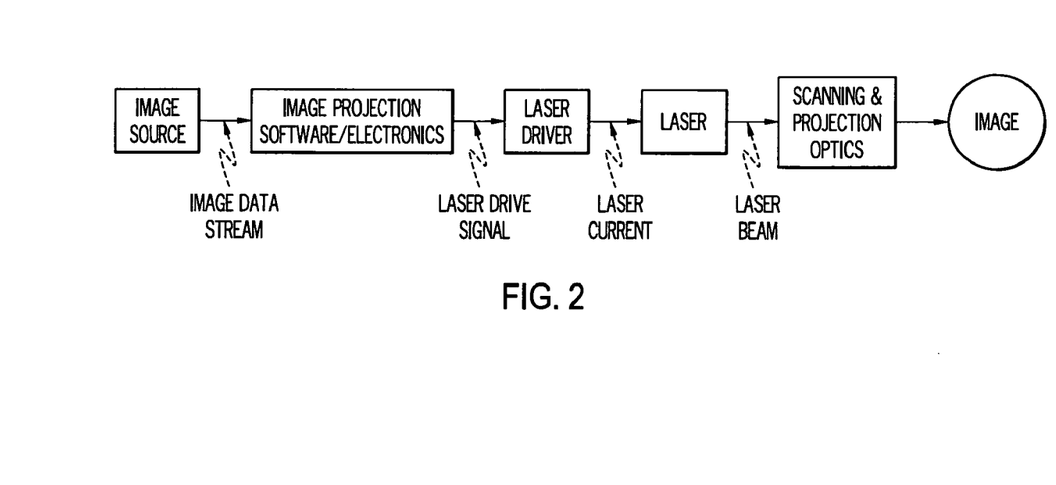
FIG. 2 is a schematic illustration of a laser projection system according to one embodiment of the present invention.
Figure 5:
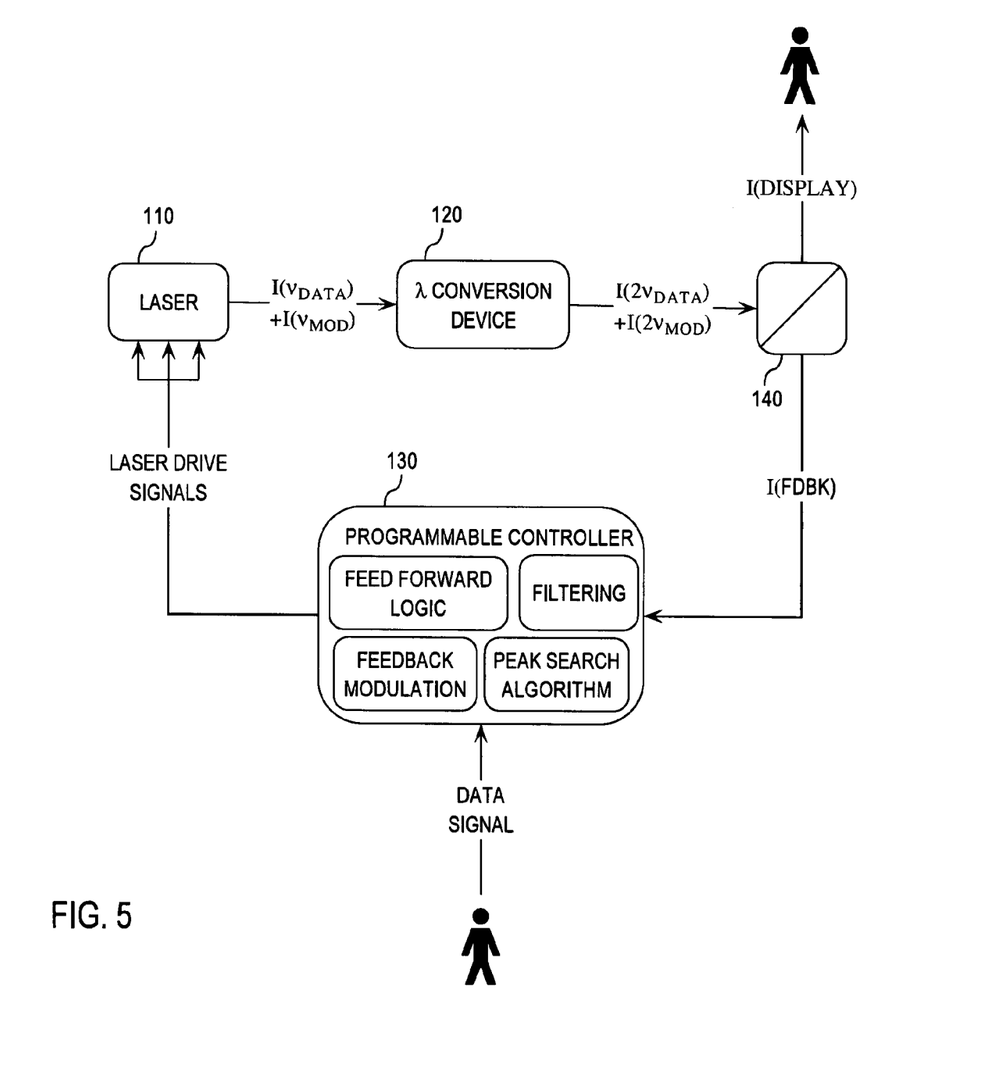
FIG. 5 is a schematic illustration of a programmable light source according to one embodiment of the present invention.

Although the present invention is not limited to any particular manifestation of the wavelength variations described herein, if these phenomena occur in a laser projection system, an example of which is illustrated schematically in FIG. 2, these wavelength fluctuations can create intensity variations and noise in the projected image that would be readily visible to the human eye. According to one embodiment of the present invention, a programmable light source is introduced to address this problem. Referring to FIG. 5, the light source 100 comprises at least one semiconductor laser 110, a wavelength conversion device 120, and a laser controller 130 programmed to operate the semiconductor laser 110. Typically, as is noted above, the laser 110 will comprise a wavelength selective section, a gain section, etc. The output of the semiconductor laser 110 is coupled to the input of the wavelength conversion device 120, and the laser controller is programmed to execute or direct execution of steps or acts according to the present invention.

Specifically, in accordance with one embodiment of the present invention, the laser controller 130 is programmed to control the periodic lasing intensity of the semiconductor laser 110 by controlling the injection of gain current $I_{GAIN}$ into the gain section of the semiconductor laser 110. Typically, the frequency $V_{DATA}$ of the gain current $I_{GAIN}$ represents a video image or some other type of encoded data signal.

The controller 130 is also programmed to control the lasing wavelength $\lambda_1$ of the semiconductor laser 110 by using a wavelength control signal to control the index of refraction of the wavelength selective section, subsequently by controlling the temperature $T_\lambda$, vis-à-vis a thermal effect, or the carrier density via a carrier effect or the electrical field via a electro-optical effect. The thermal effect can be conveniently realized by a heater current in electrically resistive heating elements thermally coupled to the wavelength selective section of the semiconductor laser 110 or a injection current into the DBR wavelength selective section. Alternatively, The carrier effect can be realized by an injection current in the wavelength selective section of the semiconductor laser 110. In addition, an electro-optical effect can be introduced by the voltage bias applied to the wavelength selective section.

Given the aforementioned ability to control the lasing wavelength $\lambda_1$, it is further noted that the controller 130 can be programmed to direct modulation the lasing wavelength $\lambda_1$ by using one or more of the above-noted wavelength control mechanisms to create a modulated control signal. According to this aspect of the present invention, the frequency $V_{MOD}$ of the modulated control signal, as manifested in the modulated output intensity $I(2V_{MOD})$ of the wavelength conversion device 120, is substantially different than the frequency $V_{DATA}$ of the data signal, as established in controlling the gain current $_{GAIN}$ and as manifested in the data signal output intensity $I(2V_{DATA})$ of the wavelength conversion device 120. For the convenience of illustration, the modulated output intensity $I(V_{MOD})$ and the data signal output intensity $I(V_{DATA})$ of the wavelength conversion device 120 are illustrated in FIG. 5 by referring to $I(2V_{MOD})$ and $I(2V_{DATA})$ because many applications of the present invention will utilize a frequency-doubling SHG crystal as the wavelength conversion device 120.

Given the two distinct portions of the output signal of the wavelength conversion device 120, the controller can be further programmed to determine whether the lasing wavelength $\lambda_1$ is shorter or longer than the conversion efficiency peak of the wavelength conversion device 120, an example of which is illustrated in FIG. 3. To do so, the controller 130 can be programmed to compare the modulated output intensity $I(2V_{MOD})$ with the modulated control signal and adjust the wavelength control signal to increase the lasing wavelength $\lambda_1$ when the comparison indicates that the lasing wavelength $\lambda_1$ is shorter than the conversion efficiency peak and decrease the lasing wavelength $\lambda_1$ when the comparison indicates that the lasing wavelength $\lambda_1$ is longer than the conversion efficiency peak.

For example, where the controller 130 is programmed to control the lasing wavelength $\lambda_1$ of the semiconductor laser 110 by controlling the temperature $T_\lambda$ of the wavelength selective section of the laser 110, the lasing wavelength $\lambda_1$ will increase with increasing heater current. If this heater current is subject to modulation by the modulated control signal, increases in the modulated control signal will correspond to increases in the temperature $T_\lambda$ of the wavelength selective section and increases in the lasing wavelength $\lambda_1$. Accordingly, the position of the lasing wavelength $\lambda_1$, relative to the conversion efficiency peak illustrated in FIG. 3, can be determined by comparing the behavior of the modulated control signal with the modulated output intensity $I(2V_{MOD})$ of the wavelength conversion device. If an increase in the modulated control signal, as is represented by $\lambda_{MOD}$ in FIG. 3, serves to increase the magnitude of the modulated output intensity $I(2V_{MOD})$ by $\Delta I$, one can deduce that the lasing wavelength $\lambda_1$ must reside on the short wavelength side of the conversion efficiency peak because the increasing feedback control signal would be in phase with the increasing portion of the conversion efficiency curve. Alternatively, if an increase in the modulated control signal serves to decrease the magnitude of the modulated output intensity $I(2V_{MOD})$ by $\Delta I$, one can deduce that the lasing wavelength $\lambda_1$ must reside on the long wavelength side of the conversion efficiency peak because, to reduce the output intensity, the increasing feedback control signal must define wavelength values that are out of phase with the conversion efficiency curve. Suitable corrections to the lasing wavelength control signal can be made once the position of the lasing wavelength $\lambda_1$ relative to the conversion efficiency peak has been determined.

Analogous approaches can be made in cases where mechanisms other than heater current dominate control of the lasing wavelength. For example, in the case of a DBR laser, when the DBR injection current is low, the carrier effect attributable to modulated DBR injection current is typically stronger than the thermal effect attributable to the injection current and the lasing wavelength actually decreases with increases in the modulated control signal. Accordingly, the inverse of the above-described modulation/wavelength relationship would control. More specifically, if an increase in the modulated control signal serves to decrease the magnitude of the modulated output intensity, one can deduce that the lasing wavelength must reside on the short wavelength side of the conversion efficiency peak because the increasing feedback control signal must be out of phase with the increasing portion of the conversion efficiency curve.

Figure 4:
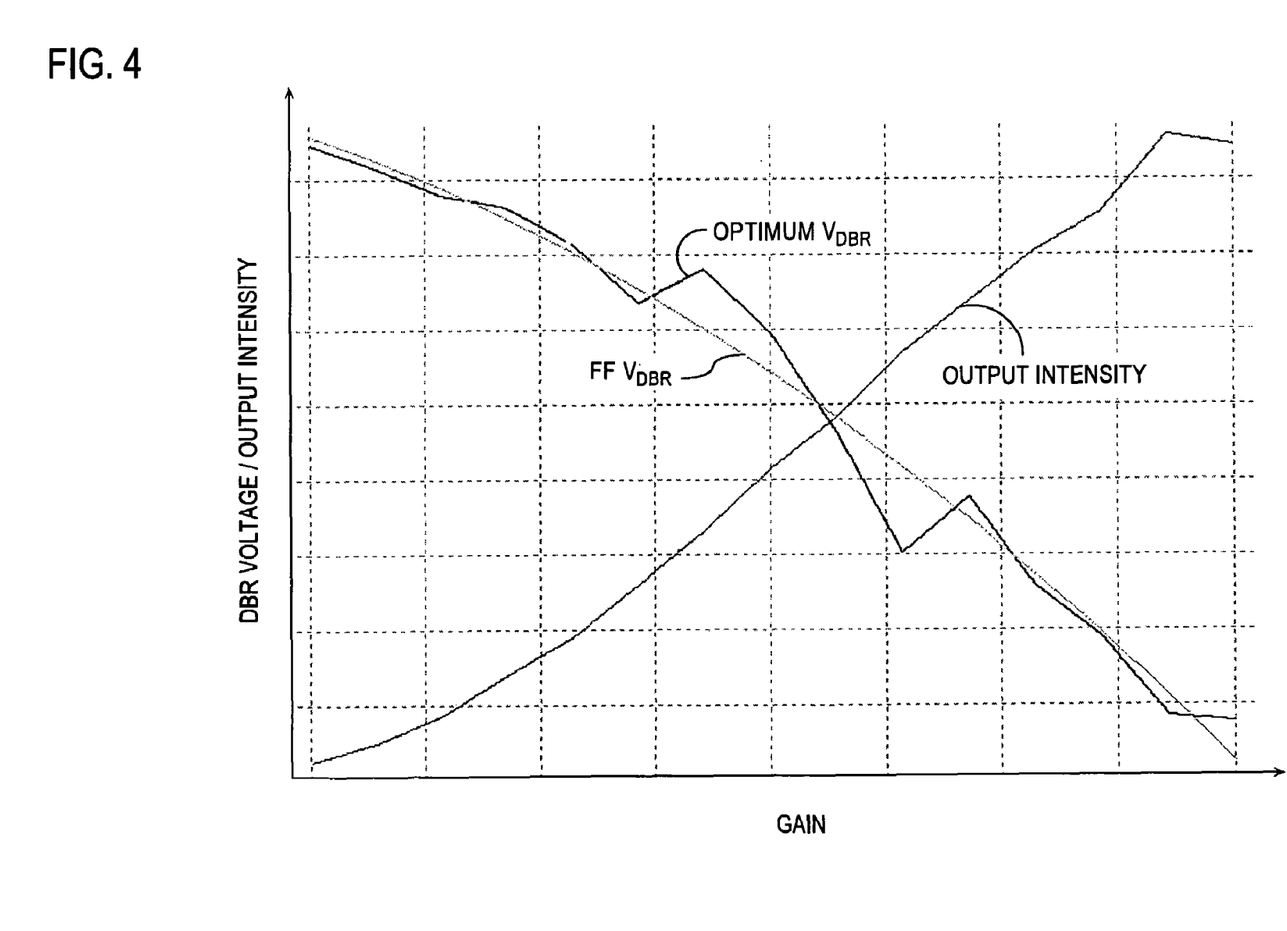
FIG. 4 illustrates the evolution of optimum and actual DBR voltage under increasing gain current in a semiconductor laser.

The present inventors have recognized benefits attributable to incorporating a feed forward control scheme with the aforementioned feedback control scheme. Specifically, the present invention contemplates the use of a feed forward scheme designed to place the lasing wavelength in the approximate vicinity of the conversion efficiency peak prior to application of the feedback control procedures described herein. According to this aspect of the present invention, the controller is programmed to execute feed forward control of a parameter of the semiconductor laser as a function of the gain current $I_{GAIN}$. Typically, the gain current $I_{GAIN}$ will vary continuously over time because it carries variable intensity data. This intentional variation of $I_{GAIN}$ produces unintentional temperature variation of the wavelength selective section, resulting in unintentional wavelength variation. This variation of wavelength can be at least partially corrected for in a feed forward manner by controlling the temperature $T_\lambda$ of the wavelength selective section, the amount of current $I_\lambda$ injected into the wavelength selective section, or both, as a function of the gain current $I_{GAIN}$. For example, the feed forward control can be manifested in the encoded data signal by referring to a lookup table that correlates selected gain currents $I_{GAIN}$ with corresponding temperature $T_\lambda$ or DBR control signal values. For example, referring to FIG. 4, generally, as output intensity increases with increasing gain current $I_{GAIN}$, the optimum DBR voltage applied to a DBR heater of a DBR laser will fall towards a minimum value. Accordingly, the aforementioned lookup table, or some other means, can be used to establish a set of DBR voltages (FF $V_{DBR}$) that are associated with corresponding gain currents $I_{GAIN}$. In this manner, feed forward action can be used in the present invention to place the lasing wavelength control signal in the vicinity of the peak of the conversion efficiency curve prior to application of one of the feedback techniques described herein. This aspect of the present invention is particularly useful where the conversion efficiency curve is complex and includes one or more minor peaks near the maximum efficiency peak.

The inventors realize that in order for the modulated feedback signal to effectively modulate the lasing wavelength of a DBR laser, a technique called Return-to-Zero (RZ) is useful. Since a DBR laser sometimes has the tendency to lock to a particular cavity mode, the modulation of the lasing wavelength can be very small even if the modulated feedback signal is applied to the wavelength selective section, reducing the effectiveness of the control scheme. To make the lasing wavelength more responsive to the modulated feedback signal, the gain-section drive current is periodically reset to zero.

Figure 6:
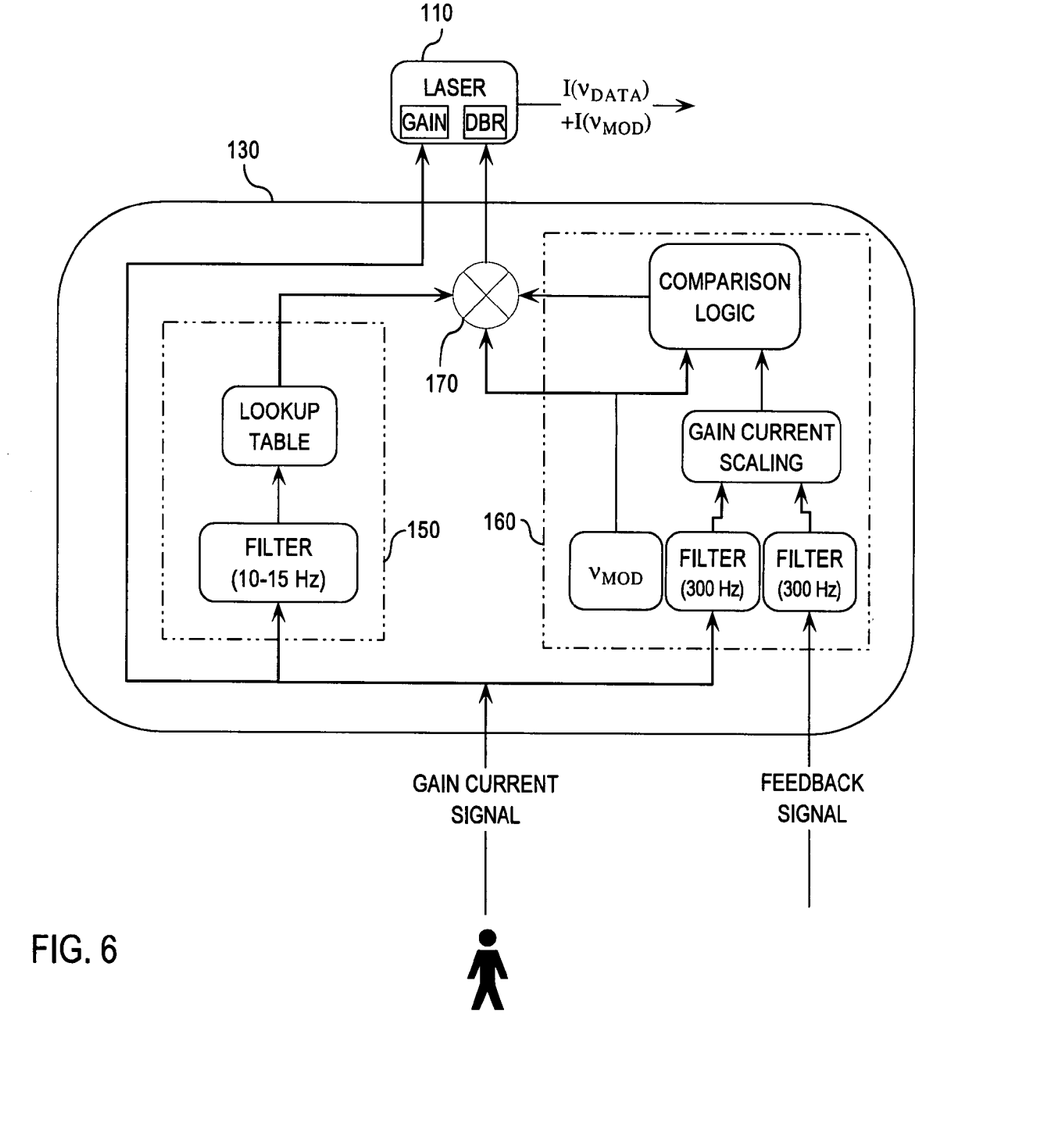
FIG. 6 is a schematic illustration of the manner in which a programmable controller according to one embodiment of the present invention can be configured.

FIG. 6 illustrates the manner in which a programmable controller 130 according to one embodiment of the present invention can be configured to incorporate the functionality of the aforementioned feed forward 150 and feedback 160 control segments. The feed forward control segment 150 can include a lookup table, as is noted above, and a suitable signal filtering component. The feedback control segment 160 is configured to generate the aforementioned frequency $V_{MOD}$ of the modulated control signal and further includes signal filtering components, gain current scaling logic, and logic for comparing the modulated control signal with the scaled control signal. More specifically, according to particular embodiments of the present invention, the controller 130 can be programmed to compare a feedback signal representing the intensity of the frequency-converted modulated output intensity $I(2V_{MOD})$ with the modulated control signal by integrating the product of the modulated control signal and the modulated output intensity $I(2V_{MOD})$ over a given modulation period. The controller can also be programmed to compensate for delay introduced in filtering and detecting the modulated output intensity $I(2V_{MOD})$ by shifting the modulated control signal in time relative to the modulated output intensity $I(V_{MOD})$ prior to integration. Output signals representing the aforementioned comparison, the modulated control signal, and the output of the feed forward segment 150 are combined via a suitable summation component 170 and are used to drive the DBR section of the laser 110.

FIG. 6 also illustrates a signal normalization mechanism that can be incorporated in the methodology of the present invention to enhance analysis of conversion efficiency, as opposed to merely frequency-converted output intensity. Specifically, referring to FIG. 6, the controller 130 can be programmed to divide the filtered feedback signal by the filtered gain current signal to normalize the resulting control signal. As a result, the feedback control segment 160 will have similar responses to relatively low and relatively high laser power and will be less susceptible to variations in the frequency content of the input data signal. It is noted that the frequencies values listed for the various signal filtering components are presented as illustrative examples only and should not be taken to limit the scope of the present invention.

Figure 7:
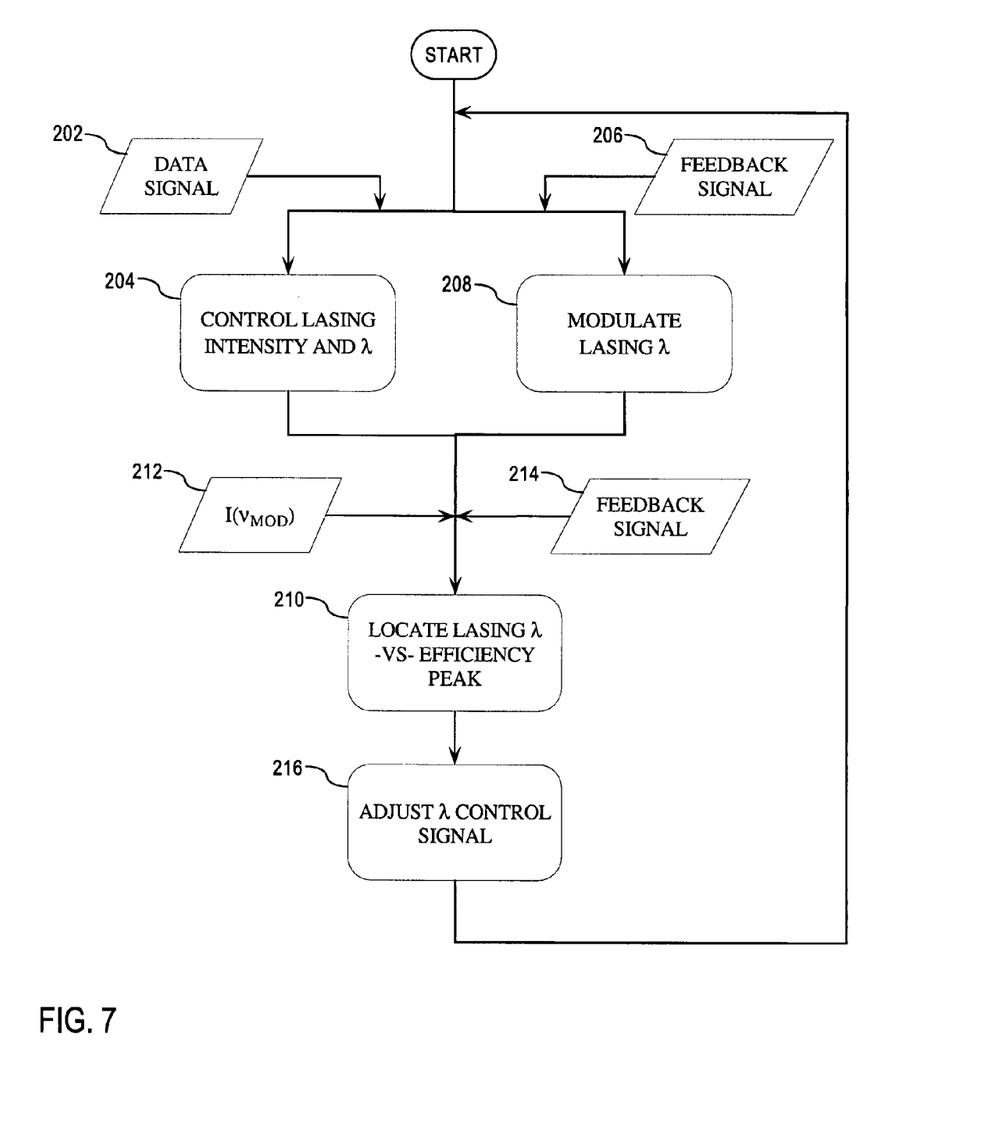
FIG. 7 is a flow chart illustrating processes according to specific embodiments of the present invention.

Processes according to specific embodiments of the present invention can be described with reference to the flow chart of FIG. 7, where the gain current data signal is illustrated as an input for controlling lasing intensity and lasing wavelength (see input 202 and step 204) and the modulated control signal is illustrated as an input for modulating the laser (see steps 206, 208). The position of the lasing wavelength $\lambda_1$, relative to the conversion efficiency peak is determined in step 210 from data representing the modulated output intensity $I(2V_{MOD})$ and the modulated control signal (see inputs 212, 214). Suitable corrections to the lasing wavelength control signal are made once the position of the lasing wavelength $\lambda_1$ relative to the conversion efficiency peak has been determined (see step 216). The feedback loop can be run in continuous mode.

According to one aspect of the present invention, care is taken to ensure that the frequency $V_{MOD}$ of the modulated control signal has very little content at the frequency of the data signal to avoid confusion between the data signal and the control signal. For example, in the case of a video projection system, the frequency $V_{MOD}$ of the modulated control is set to a value where the content of the video signal, and its higher order harmonics, are at a minimum. For video projection systems that operate at frame rates of about 60Hz, the frequency $V_{MOD}$ of the modulated control signal, as manifested in a modulated output intensity $I(V\lambda_{MOD})$ of the wavelength conversion device, can be set to be about 0.5, 1.5, 2.5, 3.5, etc., times the value of the frequency $V_{DATA}$ of the gain current $I_{GAIN}$. In this manner, those practicing this aspect of the present invention can ensure that portions of the signal representing the video data can be discriminated from portions of the signal representing the modulated control signal. Typically, it is most convenient to establish the frequency $V_{MOD}$ of the modulated control signal at a higher value than the frequency $V_{DATA}$ of the gain current $I_{GAIN}$.

It is also significant to note that the use of the modulated feedback control signal described herein can also smooth or average-out sudden wavelength changes in the laser output, particularly where the laser is shut down very frequently during normal data signal processing. Accordingly, aspects of the present invention are particularly well-suited for laser control schemes where the laser is shut down very frequently during normal data signal processing, including, for example, the control schemes taught in commonly assigned, copending U.S. patent application Ser. No. 11/549, 856, filed Oct. 16, 2006, for WAVELENGTH CONTROL IN SEMICONDUCTOR LASERS (D 20106/SP06-157), the disclosure of which is incorporated herein by reference.

Additional embodiments of the present invention contemplate control of the lasing intensity of the semiconductor laser such that the frequency $V_{MOD}$ of the modulated control signal exceeds the corresponding frame rate of the encoded data signal. Accordingly, for applications of the present invention where the frequency $V_{DATA}$ of the gain current $I_{GAIN}$ represents video content projected across a pixel array, it can be advantageous to ensure that the frequency $V_{MOD}$ of the modulated control signal is high enough to ensure that the projection system cycles through a plurality of modulated control signal periods for each image pixel. In addition, it can be helpful to ensure that the lasing wavelength $\lambda_1$ of the semiconductor laser is controlled to ensure that that the amplitude of the modulated output intensity $I(V\lambda_{MOD})$ is a mere fraction of the amplitude of the data signal output intensity $I(V\lambda_{DATA})$.

Alternatively, or additionally, under some circumstances it may be beneficial to ensure that the lasing wavelength $\lambda_1$ of the semiconductor laser is modulated with a modulated control signal that comprises multiple frequency components. Laser projection can thus be enhanced by comparing the modulated output intensity $I(V_{MOD})$ with more than a single frequency component of the modulated control signal because a particular modulation frequency may perform better than others under particular circumstances. If simultaneous modulation at a plurality of frequencies is not practical or desired, it is contemplated that the controller can be programmed to modulate the lasing wavelength $\lambda_1$ using a frequency $V_{MOD}$ that changes over time in a random or periodic fashion. Further, it is contemplated that the waveform shape and/or amplitude of the feedback signal can also be changed over time to enhance the feedback operation. Finally, it is noted that the modulated control signal can be modulated to carry encoded correlation data for subsequent adjustment of the wavelength control signal.

Alternatively, or additionally, under some circumstances it may be beneficial to ensure that the lasing wavelength $\lambda_1$ of the semiconductor laser is modulated with a modulated feedback control signal that comprises multiple frequency components. Laser projection can thus be enhance by comparing the modulated output intensity $I(V_{MOD})$ with more than a single frequency component of the modulated feedback control signal because a particular modulation frequency may perform better than others under particular circumstances. If simultaneous modulation at a plurality of frequencies is not practical or desired, it is contemplated that the controller can be programmed to modulate the lasing wavelength $\lambda_1$ using a periodic frequency $V_{MOD}$ that changes over time in a random or periodic fashion. Further, it is contemplated that the waveform shape and/or amplitude of the feedback signal can also be changed over time to enhance the feedback operation. Finally, it is noted that the modulated feedback control signal can be modulated to carry encoded correlation data for subsequent adjustment of the wavelength control signal.

For DBR lasers, and many other semiconductor lasers that utilize a gain section and a wavelength selective section, proper control of the DBR section of the laser is dictated by the gain section to DBR crosstalk. Basically, as the gain section is driven with a variety of gain current signals, part of the heat generated in the gain section gets transferred to the DBR section. Accordingly, care can be taken to compensate for this crosstalk by applying a crosstalk compensation signal to the DBR section. In general, the crosstalk effect is a relatively slow process, e.g., on the order of 10-30 ms, because the heat takes some time to propagate from the gain section to the DBR section. Accordingly, from this perspective the DBR control loop need not be excessively fast and the frequency of the feedback modulation signal can be about 100 Hz. However, depending on the parameters of the laser in use, a second mechanism may generate much faster crosstalk, particularly where photons generated in the gain section get absorbed in the DBR section and generate some heating in the DBR section. The resulting heat is transferred quasi-instantly, or at least much faster than the relatively slow crosstalk. Indeed, it is contemplated that this quasi-instant crosstalk mechanism can generate 25% power fluctuations over a time scale on the order of about 1 μs. To compensate for these fluctuations, those practicing the present invention can use modulation frequencies in the feedback signal well above 100 Hz. According to another contemplated approach the relatively fast DBR-to-gain crosstalk can be calibrated and controlled in an open loop and applied in addition to the aforementioned, relatively slow feedback loop.

It is noted that although the present invention has been described with reference to control of the wavelength selective or DBR section of a semiconductor laser, similar benefits may be enjoyed by controlling those properties of the phase section of a DBR laser that affect lasing wavelength.

Returning to FIG. 5, it is noted that the programmable controller 130 may further comprise a frequency-based filter configured to discriminate between the frequency $V_{MOD}$ of the modulated control signal and the frequency $V_{DATA}$ of the gain current $I_{GAIN}$. By utilizing a suitably configured optical splitter 140, the vast majority $I_{(DISPLAY)}$ of the signal output from the wavelength conversion device 120 can projected without filtering and a small portion $I_{(FEEDBACK)}$ of the output signal can be directed to the programmable controller 130 and associated circuitry. The controller 130 is programmed to remove the content of the encoded data signal from a portion of the data signal output intensity to permit comparison of the modulated output intensity $I(V_{MOD})$ with the modulated control signal.

Other embodiments of the present invention contemplate controllers that are programmed to determine whether the lasing wavelength $\lambda_1$ is shorter or longer than the conversion efficiency peak of the wavelength conversion device 120 by comparing noise fluctuation in the modulated output intensity $I(V_{MOD})$ with the modulated control signal. For example, the controller can be programmed to correlate increases or decreases in the amplitude of the modulated control signal with corresponding increases or decreases in the amount of noise in the modulated output intensity $I(V_{MOD})$ to determine whether modulated control signal is in phase with or out of phase with the conversion efficiency curve of the wavelength conversion device. Still other embodiments of the present invention contemplate controllers that are programmed to determine whether the lasing wavelength $\lambda_1$ is shorter or longer than the conversion efficiency peak by comparing amplitude fluctuation in the modulated output intensity $I(V_{MOD})$ with the modulated control signal. For example, controllers according to this aspect of the present invention can be programmed to correlate increases or decreases in the amplitude of the modulated control signal with corresponding increases or decreases in the amplitude of the modulated output intensity $I(V_{MOD})$ to determine whether modulated control signal is in phase with the conversion efficiency curve of the wavelength conversion device.

It is noted that reference herein to single mode lasers or lasers configured for single mode optical emission should not be taken to restrict the scope of the present invention to lasers that operate in a single mode exclusively. Rather, the references herein to single mode lasers or lasers configured for single mode optical emission should merely be taken to imply that lasers contemplated according to particular embodiments of the present invention will be characterized by an output spectrum where a single mode of broad or narrow bandwidth is discernable therein or by an output spectrum that is amenable to discrimination of a single mode there from through suitable filtering or other means.

A multi-tone image can be generated by image projection systems according to the present invention by configuring the image projection electronics and the corresponding laser drive currents to establish a pixel intensity that varies across an array of image pixels. For example, where the programmable light source is comprised within a pixel-based laser projection system, controllers according to the present invention may be programmed to control the lasing intensity of the semiconductor laser such that the encoded data signal comprises a plurality of encoded data periods corresponding to the frame rate of the projection system.

It is contemplated that programmable light sources according to the present invention may comprise a plurality of semiconductor lasers, at least one of which is coupled to the wavelength conversion device and controlled according to one or more of the control procedures contemplated by the present invention. Further detail concerning the configuration of scanning laser image projection systems and the manner in which varying pixel intensities are generated across an image may be gleaned from a variety of readily available teachings on the subject. Although the present invention is clearly applicable to pixel-based projection systems, it is contemplated that other projection systems, such as spatial light modulator based systems (including digital light processing (DLP), transmissive LCD, and liquid crystal on silicon (LCOS)), incorporating laser-based light sources may also benefit from the wavelength control techniques described herein.

Reference is made throughout the present application to various types of currents. For the purposes of describing and defining the present invention, it is noted that such currents refer to electrical currents. Further, for the purposes of defining and describing the present invention, it is noted that reference herein to "control" of an electrical current does not necessarily imply that the current is actively controlled or controlled as a function of any reference value. Rather, it is contemplated that an electrical current could be controlled by merely establishing the magnitude of the current.

It is to be understood that the preceding detailed description of the invention is intended to provide an overview or framework for understanding the nature and character of the invention as it is claimed. It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

For the purposes of defining and describing the present invention, it is noted that reference herein to values that are "on the order of" a specified magnitude should be taken to encompass any value that does not vary from the specified magnitude by one or more orders of magnitude. It is also noted that one or more of the following claims recites a controller "programmed to" execute one or more recited acts. For the purposes of defining the present invention, it is noted that this phrase is introduced in the claims as an open-ended transitional phrase and should be interpreted in like manner as the more commonly used open-ended preamble term "comprising." In addition, it is noted that recitations herein of a component of the present invention, such as a controller being "programmed" to embody a particular property, function in a particular manner, etc., are structural recitations, as opposed to recitations of intended use. More specifically, the references herein to the manner in which a component is "programmed" denotes an existing physical condition of the component and, as such, is to be taken as a definite recitation of the structural characteristics of the component.

It is noted that terms like "preferably," "commonly," and "typically," when utilized herein, are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention. Further, it is noted that reference to a value, parameter, or variable being a "function of" another value, parameter, or variable should not be taken to mean that the value, parameter, or variable is a function of one and only one value, parameter, or variable.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation. e.g., "substantially above zero," varies from a stated reference, e.g., "zero," and should be interpreted to require that the quantitative representation varies from the stated reference by a readily discernable amount.

What is claimed is:

1. A programmable light source comprising at least one semiconductor laser, a wavelength conversion device, and a laser controller programmed to operate the semiconductor laser wherein the semiconductor laser comprises a wavelength selective section and a gain section, an output of the semiconductor laser is coupled to an input of the wavelength conversion device, and the laser controller is programmed to:

control lasing intensity of the semiconductor laser by controlling an amount of gain current $I_{GAIN}$ injected into the gain section of the semiconductor laser, wherein a frequency $V_{DATA}$ of the gain current $I_{GAIN}$ represents an encoded data signal;

control the lasing wavelength $\lambda_1$ of the semiconductor laser by using a wavelength control signal to control the temperature $T_\lambda$ of the wavelength selective section, an amount of current $I_\lambda$ injected into the wavelength selective section, or both;

modulate the lasing wavelength $\lambda_1$ of the semiconductor laser at a frequency $V_{MOD}$ to control the temperature $T_\lambda$ of the wavelength selective section, the amount of current $I_\lambda$ injected into the wavelength selective section, or both, wherein the frequency $V_{MOD}$ of the modulated control signal is selected such that the encoded data signal, which is modulated at the frequency $V_{DATA}$, has relatively low data content at the frequency $V_{MOD}$;

determine whether the lasing wavelength $\lambda_1$ is shorter or longer than a conversion efficiency peak of the wavelength conversion device by comparing the modulated output intensity with the modulated control signal;

adjust the wavelength control signal to increase the lasing wavelength $\lambda_1$ when the comparison indicates that the lasing wavelength $\lambda_1$ is shorter than the conversion efficiency peak and decrease the lasing wavelength $\lambda_1$ when the comparison indicates that the lasing wavelength $\lambda_1$ is longer than the conversion efficiency peak; and control the lasing wavelength $\lambda_1$ of the semiconductor laser by using the adjusted wavelength control signal.

2. A programmable light source as claimed in claim 1 wherein the frequency $V_{MOD}$ of the modulated control signal is selected such that higher frequency harmonics of the encoded data signal have relatively low data content at the frequency $V_{MOD}$.

3. A programmable light source as claimed in claim 1 wherein the controller is programmed to make the lasing wavelength $\lambda_1$ of the semiconductor laser more responsive to the wavelength control signal by reducing the tendency of the semiconductor laser to lock to a particular cavity mode.

4. A programmable light source as claimed in claim 3 wherein the controller is programmed to reduce the tendency of the semiconductor laser to lock to a particular cavity mode by periodically resetting the gain current $I_{GAIN}$ injected into the gain section to zero.

5. A programmable light source as claimed in claim 1 wherein the controller is programmed to:

modulate the lasing wavelength $\lambda_1$ of the semiconductor laser using a modulated control signal comprising multiple frequency components; and compare the modulated output intensity with the frequency content of the modulated control signal.

6. A programmable light source as claimed in claim 1 wherein the controller is programmed to modulate the lasing wavelength $\lambda_1$ of the semiconductor laser using a modulated control signal comprising a frequency $V_{MOD}$ that changes over time in a random or periodic fashion.

7. A programmable light source as claimed in claim 1 wherein the modulated control signal is modulated to carry encoded correlation data for subsequent adjustment of the wavelength control signal.

8. A programmable light source as claimed in claim 1 wherein the programmable light source further comprises a frequency-based filter configured to discriminate between the frequency $V_{MOD}$ of the modulated control signal and the frequency $V_{DATA}$ of the gain current $I_{GAIN}$, as manifested in the data signal output intensity of the wavelength conversion device.

9. A programmable light source as claimed in claim 1 wherein the controller is further programmed to remove the content of the encoded data signal from a portion of the data signal output intensity to permit comparison of the modulated output intensity with the modulated control signal.

10. A programmable light source as claimed in claim 1 wherein the controller is programmed to determine whether the lasing wavelength $\lambda_1$ is shorter or longer than a conversion efficiency peak of the wavelength conversion device by comparing noise fluctuation in the modulated output intensity with the modulated control signal.

11. A programmable light source as claimed in claim 1 wherein the controller is programmed to determine whether the lasing wavelength $\lambda_1$ is shorter or longer than a conversion efficiency peak of the wavelength conversion device by comparing amplitude fluctuation in the modulated output intensity with the modulated control signal.

12. A programmable light source as claimed in claim 1 wherein the controller is programmed to modulate the lasing wavelength $\lambda_1$ of the semiconductor laser by controlling the temperature $T_\lambda$ of the wavelength selective section vis-à-vis (i) a thermal effect from a heater current in the wavelength selective section of the semiconductor laser or (ii) a thermal effect from an injection current in the gain section of the semiconductor laser.

13. A programmable light source as claimed in claim 1 wherein the controller is programmed to modulate the lasing wavelength $\lambda_1$ of the semiconductor laser by controlling the amount of current $I_\lambda$ injected into the wavelength selective section vis-à-vis a carrier effect from an injection current in the wavelength selective section of the semiconductor laser.

14. A programmable light source as claimed in claim 1 wherein the controller is programmed to compare the modulated output intensity with the modulated control signal by integrating the product of the modulated control signal and the modulated output intensity over a modulation period.

15. A programmable light source as claimed in claim 14 wherein the controller is programmed to compensate for delay in detection of the modulated output intensity by shifting the modulated control signal in time relative to the modulated output intensity prior to the comparison.

16. A programmable light source as claimed in claim 1 wherein the controller is programmed to execute feed forward control of the temperature $T_\lambda$ of the wavelength selective section, the amount of current $I_\lambda$ injected into the wavelength selective section, or both, as a function of the gain current $I_{GAIN}$.

17. A programmable light source as claimed in claim 16 wherein the feed forward control is manifested in the encoded data signal.

18. A programmable light source as claimed in claim 1 wherein:
the programmable light source comprises a plurality of semiconductor lasers; and
at least one of the semiconductor lasers is coupled to the wavelength conversion device and is subject to control according to the conditions recited in claim 1 such that the data signal output intensity of the wavelength conversion device and the lasing wavelength of the remaining semiconductor lasers occupy distinct portions of the optical spectrum.

19. A programmable light source comprising at least one semiconductor laser, a wavelength conversion device, and a laser controller programmed to operate the semiconductor laser wherein the semiconductor laser comprises a wavelength selective section, a phase matching section, and a gain section, an output of the semiconductor laser is coupled to an input of the wavelength conversion device, and the laser controller is programmed to:

control lasing intensity of the semiconductor laser by controlling an amount of gain current $I_{GAIN}$ injected into the gain section of the semiconductor laser, wherein a frequency $V_{DATA}$ of the gain current $I_{GAIN}$ represents an encoded data signal;

control the lasing wavelength $\lambda_1$ of the semiconductor laser by using a wavelength control signal to control the temperature $T_\lambda$ of the wavelength selective or phase matching section, an amount of current $I_\lambda$ injected into the wavelength selective section or phase matching section, or combinations thereof;

modulate the lasing wavelength $\lambda_1$ of the semiconductor laser at a frequency $V_{MOD}$ to control the temperature $T_\lambda$ of the wavelength selective or phase matching sections, the amount of current $I_\lambda$ injected into the wavelength selective or phase matching sections, or combinations thereof, wherein the frequency $V_{MOD}$ of the modulated control signal is selected such that the encoded data signal, which is modulated at the frequency $V_{DATA}$, has relatively low data content at the frequency $V_{MOD}$;

determine whether the lasing wavelength $\lambda_1$ is shorter or longer than a conversion efficiency peak of the wavelength conversion device by comparing the modulated output intensity with the modulated control signal;

adjust the wavelength control signal to increase the lasing wavelength $\lambda_1$ when the comparison indicates that the lasing wavelength $\lambda_1$ is shorter than the conversion efficiency peak and decrease the lasing wavelength $\lambda_1$ when the comparison indicates that the lasing wavelength $\lambda_1$ is longer than the conversion efficiency peak; and control the lasing wavelength $\lambda_1$ of the semiconductor laser by using the adjusted wavelength control signal.

20. A method of operating a programmable light source comprising at least one semiconductor laser and a wavelength conversion device, wherein the semiconductor laser comprises a wavelength selective section and a gain section and an output of the semiconductor laser is coupled to an input of the wavelength conversion device, the method comprising:

controlling the lasing intensity of the semiconductor laser by controlling an amount of gain current $I_{GAIN}$ injected into the gain section of the semiconductor laser, wherein a frequency $V_{DATA}$ of the gain current $I_{GAIN}$ represents an encoded data signal;

controlling the lasing wavelength $\lambda_1$ of the semiconductor laser by using a wavelength control signal to control the temperature $T_\lambda$ of the wavelength selective section, an amount of current $I_\lambda$ injected into the wavelength selective section, or both;

modulating the lasing wavelength $\lambda_1$ of the semiconductor laser by using a modulated control signal to control the temperature $T_\lambda$ of the wavelength selective section, the amount of current $I_\lambda$ injected into the wavelength selective section, or both, wherein the frequency $V_{MOD}$ of the modulated control signal is selected such that the encoded data signal, which is modulated at the frequency $V_{DATA}$, has relatively low data content at the frequency $V_{MOD}$;

determining whether the lasing wavelength $\lambda_1$ is shorter or longer than a conversion efficiency peak of the wavelength conversion device by comparing the modulated output intensity with the modulated control signal;

adjusting the wavelength control signal to increase the lasing wavelength $\lambda_1$ when the comparison indicates that the lasing wavelength $\lambda_1$ is shorter than the conversion efficiency peak and decrease the lasing wavelength $\lambda_1$ when the comparison indicates that the lasing wavelength $\lambda_1$ is longer than the conversion efficiency peak; and controlling the lasing wavelength $\lambda_1$ of the semiconductor laser by using the adjusted wavelength control signal.

* * * * *

UNITED STATES PATENT AND TRADEMARK OFFICE
CERTIFICATE OF CORRECTION

PATENT NO. : 7,505,492 B2
APPLICATION NO. : 11/894846
DATED : March 17, 2009
INVENTOR(S) : Jacques Gollier et al.

It is certified that error appears in the above-identified patent and that said Letters Patent is hereby corrected as shown below:

Title Page;

| No. | Col. | Line | Description |
|---|---|---|---|
| 1 | | (75) | Replace --Daniel Ohen Rickets-- with --Daniel Ohen Ricketts--. |

Signed and Sealed this

Thirtieth Day of March, 2010

David J. Kappos
*Director of the United States Patent and Trademark Office*